US00RE34158E

United States Patent [19]

Watanabe et al.

[11] E Patent Number: Re. 34,158

[45] Reissued Date of Patent: Jan. 12, 1993

[54] COMPLEMENTARY SEMICONDUCTOR DEVICE

[75] Inventors: Atsuo Watanabe, Hitachiota; Takahiro Nagano, Hitachi; Takahide Ikeda, Tokorozawa; Naohiro Momma; Ryuichi Saito, both of Hitachi, all of Japan

[73] Assignee: Hitachi, Ltd., Tokyo, Japan

[21] Appl. No.: 744,514

[22] Filed: Aug. 13, 1991

Related U.S. Patent Documents

Reissue of:

[64] Patent No.: 4,862,240
Issued: Aug. 29, 1989
Appl. No.: 85,260
Filed: Aug. 12, 1987

U.S. Applications:

[63] Continuation of Ser. No. 788,563, Oct. 17, 1985, abandoned.

[30] Foreign Application Priority Data

Oct. 17, 1984 [JP] Japan ..... 59-216251
Nov. 26, 1984 [JP] Japan ..... 59-249339

[51] Int. Cl.[5] ..... H01L 27/02

[52] U.S. Cl. ..... 257/370; 257/375; 257/376; 257/374; 257/519; 257/520

[58] Field of Search ..... 357/42, 43, 44, 48, 357/49, 50, 55

[56] References Cited

U.S. PATENT DOCUMENTS

| | | | |
|---|---|---|---|
| 4,470,062 | 9/1984 | Muramatsu | 357/50 |
| 4,536,945 | 8/1985 | Gray et al. | 357/42 |
| 4,571,818 | 2/1986 | Robinson et al. | 357/42 |
| 4,729,008 | 3/1988 | Beasom | 357/49 |
| 4,862,240 | 8/1989 | Watanabe et al. | 357/42 |

*Primary Examiner*—Edward J. Wojciechowicz
*Attorney, Agent, or Firm*—Antonelli, Terry, Stout & Kraus

[57] ABSTRACT

A monolithic complementary semiconductor device comprising n-type and p-type well regions separated by a dielectric isolation region extending from the surface into the substrate region. The well region includes a highly doped buried region which is located at the bottom of the well region and separates an active region in the wall from the substrate region. The isolation region is deeper than the buried region. The well-to-well isolation is enhanced by the combination of the buried region and the deep dielectric isolation region. Packing density and the high speed operation can also be improved.

31 Claims, 9 Drawing Sheets

COMPLEMENTARY SEMICONDUCTOR DEVICE

Matter enclosed in heavy brackets [ ] appears in the original patent but forms no part of this reissue specification; matter printed in italics indicates the additions made by reissue.

This application is a continuation application of application Ser. No. 788,563 filed Oct. 17, 1985 now abandoned.

BACKGROUND OF THE INVENTION

The present invention relates to a semiconductor device and, particularly, to a complementary monolithic semiconductor device including a p type well and an n type well.

As is well known in the art, there are two conductivity types in semiconductor, i.e., p type and n type. Semiconductor elements involving the structure of these opposite conductivity types include complementary elements such as pnp and npn bipolar junction transistors (BJT) and p channel and n channel field effect transistors (FET).

CMOS devices comprising n channel MOS FETs and p channel MOS FETs have the features of low power dissipation and high integration density, and are particularly suitable for use in logic circuits. Npn BJTs have the advantages of fast operation and large output.

For making semiconductor integrated circuits capable of achieving various functions, it is often required to form various semiconductor elements on the same substrate. In such cases, semiconductor substrates including p type and n type regions of relatively low impurity concentration are often required. For example, a CMOS large scale integrated circuit (LSI) is fabricated by forming n channel MOS FETs in the p type well and p channel MOS FETs in the n type well. A BI-CMOS LSI generally includes further n type wells each of which includes an npn BJT, in addition to the CMOS structure.

In semiconductor integrated circuits, isolation between elements is needed. In MOS FETs, charge carriers flow from the source to the drain along the surface, and isolation in the semiconductor bulk is usually unnecessary. In case the channel is induced along the surface, there is a risk of creating a parasitic MOS FET, and therefore each MOS FET is often surrounded [y] *by* a region of high impurity concentration serving as a channel stopper. LOCOS (local oxidation of silicon) technique, in which thick oxide films are formed selectively, is also employed in many cases.

In a CMOS integrated circuit, a p type well and n type well coexist. The contiguous disposition of a p type well including n channel MOS FETs and an n type well including p channel MOS FETs entails a pnpn four-layer structure, resulting possibly in the formation of a parasitic thyristor. Turning-on of this thyristor causes "latch-up", precluding the related MOS FETs from operating as expected. In order to prevent latch-up, the pnp and npn BJTs constituting the thyristor need to have low current amplification factors $\beta$(pnp) and $\beta$(npn). This requirement may be met by increasing the thickness and/or increasing the impurity concentration of the n region and p region which serve as base regions of these BJTs.

One countermeasure is to form a p type well in an n type substrate (the remaining n type region becomes an n type well) and form n channel MOS FETs and p channel MOS FETs in the p type well and the n type well, respectively, with a groove formed deeper than the p type well around the p type well (side wall portion of the pn junction). The groove surface may be covered with the insulator and filled with an appropriate filler material. In the surface of the p type well [$n_+$] $n^+$ type regions for a channel MOS FET are doped, and in the surface of the n type well $p^+$ type regions for p channel MOS FET are doped. The current path between the $p^+$ type and $n^+$ type regions is lengthened by the groove. In order to increase the distance from the $p^+$ type region via the n type well (substrate) to the p type well, the groove is made to have a width of 1 $\mu$m and a depth of 5.5 $\mu$m, for example. A shallow p type well allows the npn type BJT, which is made up of the [$n_+$] $n^+$ type region, p type well and n type well (substrate), to have a larger current amplification factor $\beta$(npn), and therefore the p type well is also made deeper, e.g., 4 $\mu$m or more. Reference is made to Proceedings of Meeting of the Japanese Society of Applied Physics, Mar. 1982, p 692. However, despite the above dimensional consideration, the current amplification factor (npn) of the npn BJT can be non-negligibly large, and also there is a risk of "punch-through" between the $n^+$ type region and the n type well (substrate).

In the case of BI-CMOS including vertical npn BJTs and CMOS FETs, the n type well including an npn BJT has an $n^+$ type sub-collector buried region at the bottom. An n type well for the npn BJT and n type and p type wells for the CMOS FETs are formed in the $p^-$ type substrate. When the n type and p type wells for the CMOS FETs are provided at the bottom with an [$n_+$] $n^+$ type and p type buried regions, a noise current flowing in the wells can be drawn rapidly (due to a reduced well resistance), and the current amplification factor of the parasitic BJT can be suppressed small due to the presence of the base region having a high impurity concentration. However, if the p type well and n type well are disposed contiguously, resulting in the formation of the lateral BJT structure, the effect of latch-up prevention is limited. In the npn BJT, the potential varies even in the semiconductor bulk. Insulation for the npn BJT is made by surrounding its periphery with a thick thermal oxidation film which reaches the substrate, with a $p^+$ type region being pushed down by the oxidation front and located under the oxide film. An oxide isolation region may also be provided between the p type and n type wells for the CMOS FETs. (Reference is made to Japanese Patent Unexamined Publication No. 57-188862.)

However, it is unavoidable that the buried region is expanded by further diffusion during the heat process. Diffusion can occur not only in the vertical (depth) direction, but also in [he] *the* lateral direction. In order to separate the buried sub-collector sufficiently from the buried region of the contiguous well after the heat process, the oxide isolation region must be as wide a as 6–7 $\mu$m or more. Such a dimension of the isolation region makes a bar against the improvement in the packing density. Furthermore, when a $p^+$ region is formed under the oxide adjacent to the $n^+$ type sub-collector for the isolation of the BJT, the capacitance of the npn BJT becomes large due to the $p^+$ $n^+$ junction, hampering the enchancement of the operating speed.

A preferred form of isolation for a complementary [intergrated] *integrated* circuit is the use of an SOS substrate with the provision [od] *of* oxide isolation reaching the [saphire] *sapphire* substrate. Even in this case, reduction in the well resistance is limited, and the problem of increased manufacturing cost will result.

SUMMARY OF THE INVENTION

An object of this invention is to provide a monolithic complementary semiconductor device having a high latch-up voltage.

According to one aspect of this invention, there is proposed a monolithic complementary semiconductor device, wherein a pair of contiguous wells with opposite conductivity types are provided at their bottom with low resistivity buried regions at a substantially equal level, and with a dielectric isolation groove deeper than the buried regions being formed between the weels. The buried regions decrease the well resistance, decrease the diffusion length of minority carriers, and prevent latch-up effectively. The dielectric isolation groove deeper than the buried regions prevents the creation of a lateral parasitic thyristor, realizes a narrow isolation region, and prevents the both buried regions from forming a pn junction of high capacitance.

A region with the impurity concentration higher than that of the substrate region may be provided at the bottom of the dielectric isolation groove. Such a region is effective for preventing punch-through in the periphery of the buried sub collector or the BJT.

In fabricating a CMOS integrated circuit, isolation between each MOS FET is basically unnecessary, and therefore more than one MOS FET may be formed within a well. By making at least one p type well and at least one n type well, with a desired number of n channel MOS FETs and a desired number of p channel MOS FETS being formed in the p type well and n type well, respectively, and with connection being made between both types of FETS, a desired CMOS integrated circuit can be fabricated.

In the case of BI-CMOS, each BJT needs to be isolated from the surrounding elements, and therefore it is desirable to provide a dielectric isolation groove around each BJT. More preferably, the dielectric isolation groove is provided at its bottom with a buried buffer region with a higher impurity concentration. The buried buffer region is preferably disposed deeper than and separated from the buried region at the well bottom.

The dielectric isolation groove is of any [strcuture] *structure* provided that it [substanially] *substantially* serves as a dielectric isolation groove. For example, it can be realized by high-resistance polysilicon coated with oxide and/or nitride.

DETAILED DESCRIPTION OF THE INVENTION

Figure 9:
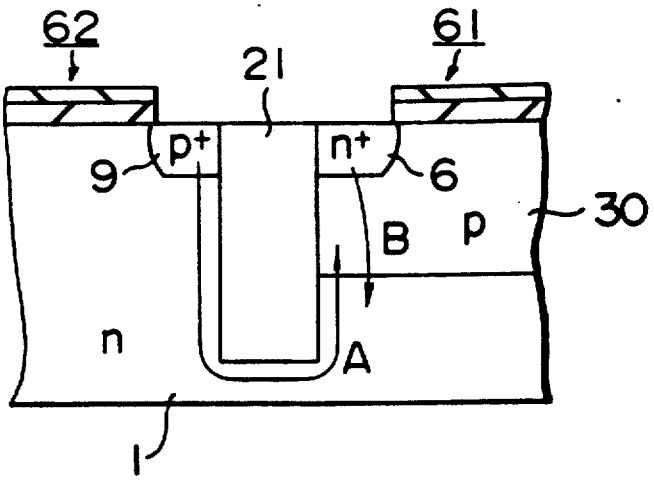
FIG. 9 is a cross-sectional view of a chip showing the isolation in a CMOS integrated circuit, as a comparison example.

For the better understanding of the present invention, a comparison example of isolation in a CMOS integrated circuit (c.f. Proceeding of Meeting of the Japanese Society of Applied Physics, Mar. 1982, p 692 which is incorporated by reference) will first be described in connection with FIG. 9.

In the figure, a p channel MOS transistor 62 and an n channel MOS transistor 61 are separated from each other by a dielectric isolation region 21 (made of oxide film and polycrystalline silicon) dimensioned by 1μ in width and 5.5μ in depth. The isolation region 21 is made deeper than the p type well 30 so that the pnp parasitic BJT has an increased base width as shown by the arrow A in the figure, with the intention of decreasing the current amplification factor of the pnp parasitic BJT and thus increasing the latch-up voltage. However, because the npn parasitic BJT in the portion indicated by the arrow B has a vertical transistor structure and the p well 30 serving as a base layer has a low impurity concentration, the npn parasitic BJT is expected to have a considerably large current amplification factor. On this account, the pnpn structure may possibly create a thyristor which may be turned on. In addition, the p type region 30 may possibly be punched through.

Figure 10A:
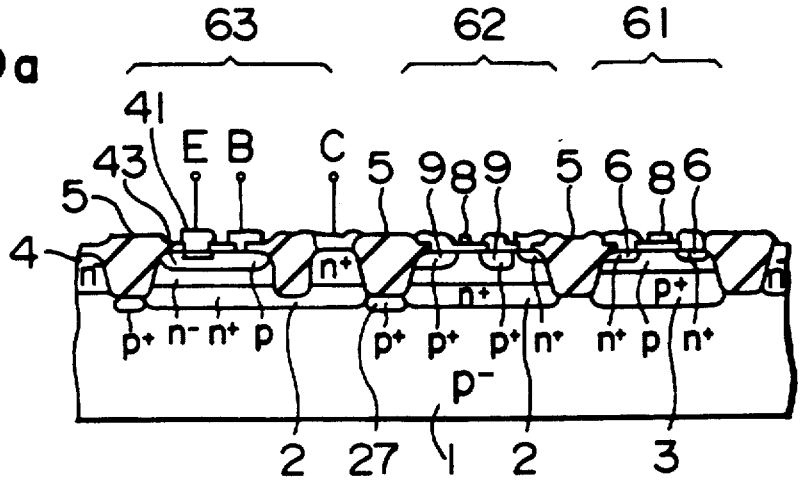
FIGS. 10a and 10b are cross-sectional views of a chip showing, the isolation in a BI-CMOS integrated circuit, as a comparison example.
Figure 10B:
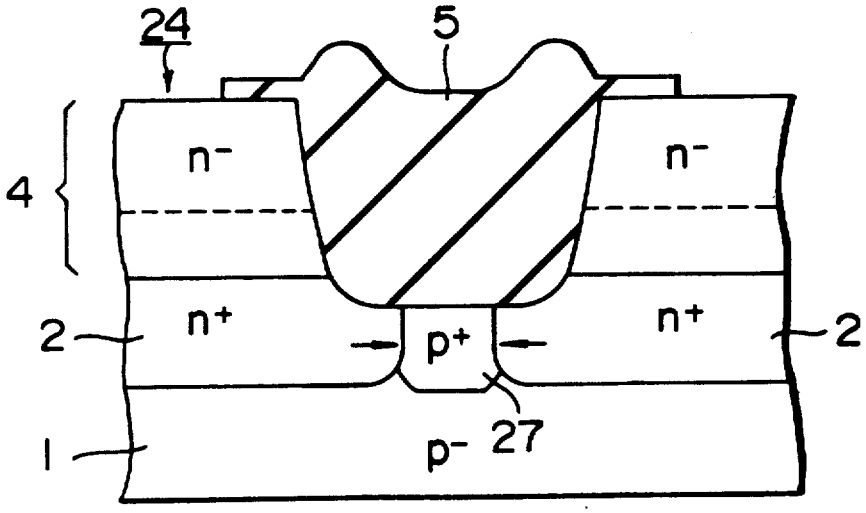

FIGS. 10a and 10b show a comparison example of BI-CMOS integrated circuit (c.f. Japanese Patent Unexamined Publication No. 57-188862, published on Nov. 19, 1982 which is incorporated by reference hereby). On the surface of a p type semiconductor substrate 1 which is provided with embedded or buried regions 2 and 3, an n type epitaxial layer 4 is grown to a thickness of about 2 μm. Portions of the epitaxial layer are converted to p type regions. Respective regions in the epitaxial layer 4 is isolated by an insulator 5 made of a thick silicon oxide ($SiO_2$) film. A $p^+$ region 27 pushed down by the oxide region 5 is disposed to surround the $n^+$ sub-collector 2. Elements formed includes an npn bipolar transistor 63, a p channel MOS transistor 62 and an n channel MOS transistor 61. Embedded between the epitaxial layer 4 and the p type semiconductor substrate 1 are $n^+$ buried regions 2 in the portions of the bipolar transistor and pMOS transistor, and a $p^+$ buried region 3 in the portion of the nMOS transistor.

The foregoing structure poses a serious problem in isolating, for example, the $n^+$ buried regions 2 located on both sides of the isolation region 5. The $n^+$ regions are subjected to various heat processes during the formation of elements, and they diffuse not only in the depth direction, but also in the lateral direction as shown by FIG. 10b. The $n^+$ buried regions 2 have their side faces diffusing in the lateral direction shown by the arrows in the figure. As a result, the distance between the adjacent $n^+$ buried regions 2 becomes smaller than the width of the isolation region 5. Since the $n^+$ buried regions 2 have the isolation breakdown voltage determined from the distance between them, it is necessary to design a wider isolation region 5 so as to accomodate the lateral diffusion of the $n^+$ buried regions 2, when it is intended to ensure a desired breakdown voltage.

Therefore, it is difficult to realize a high-density semiconductor integrated device by decreasing the isolation width. In practice, it has not been feasible to make the isolation region 5 narrower than 7-6 μm.

The buried regions 2 are disposed in contact with the $p^+$ buried region 27. When high impurity concentration regions are in contact with each other, a large electrostatic capacitance is created at the contact surfaces. The $n^+$ buried region 2 is the collector region of the npn bipolar transistor 63, and a large capacitance results in a low operating speed. Accordingly, the structure of the $n^+$ buried regions 2 and $p^+$ buried region 3 in contact with each other is undesirable from the viewpoint of speeding up the operation of the circuit.

Next, embodiments of the present invention will be described.

Figure 1:
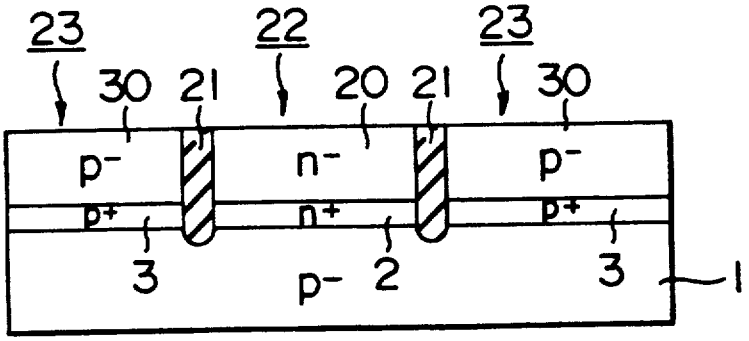
FIGS. 1 to 3 are partial cross-sectional views of a semiconductor chip schematically showing fundamental embodiments of the present invention.

FIG. 1 shows a semiconductor chip according to this invention. In a surface of a $p^+$ type substrate 1, $n^+$ type embedded or buried region 2 and $p^+$ type embedded or buried regions 3 of high impurity concentration are formed, and then an $n^+$ type region 20 and $p^+$ type regions 30 are formed, respectively thereon. The $n^+$ buried region 2 and $n^-$ region 20 in unison constitute an n type well 22, while each $p^+$ buried region 3 and a $p^+$ region 30 in unison constitute a p type well 23. At the boundary of the p type well 23 and the n type well 22, a narrow groove is formed deep into the substrate region 1, which is filled with the insulation filler to form a dielectric isolation region 21. It is important for the dielectric isolation regions to extend through the lightly doped region 20 and 30 and the heavily doped buried regions 2 and 3, thereby isolating the n type well 22 from the p type wells 23 effectively.

Figure 2:
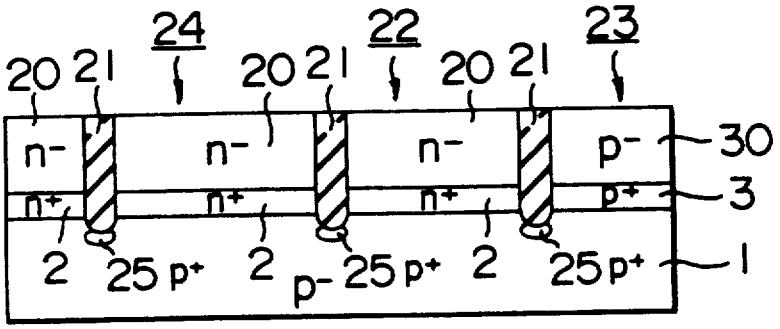

FIG. 2 shows another embodiment of this invention, in which like portions to those in FIG. 1 are indicated by the like numerals or symbols. In the arrangement, another n type well 24 is defined in the n type well 22, and surrounded by the dielectric isolation regions 21. There is also another dielectric isolation region 21 between the p well 23 and the n well 22. Each isolation region 21 extends through the buried regions 2 and 3 into the substrate region 1. Further, a $p^+$ buried region 25 of higher concentration than the $p^-$ substrate region 1 is provided at the bottom to the isolation region 1 so that it is in contact with the lower portion of each isolation region 21. This $p^+$ buried region is effective for the separation between adjacent $n^+$ buried regions 2. For example, the buried region 25 prevents short-circuiting of the wells 24 and 22 that would occur when part of the substrate region 1 in contact with the surface of the isolation region 21 is inverted, and also prevents the $p^-$ substrate 1 from being punched through between adjacent $n^+$ buried regions 2 when a BJT is formed in the well 24. The arrangement of FIG. 2 is particularly suited for fabricating BI-CMOS LSI.

Forming a groove is prone to create crystal defects and the like at portions near the groove wall, and therefore regions near the groove are apt to be inferior in electronical characteristics. Moreover, separation of MOS FETs needs a LOCOS region.

Figure 3:
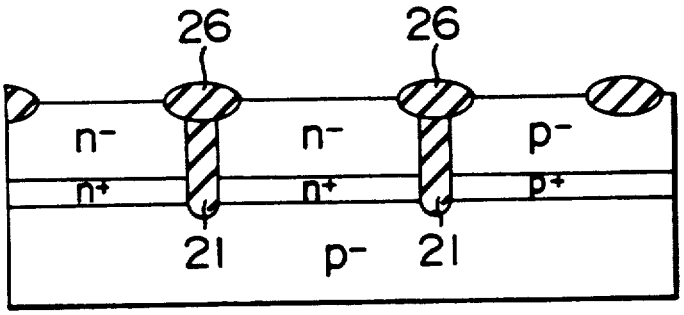

FIG. 3 is a cross-sectional view of a chip which is provided with thick oxide films (LOCOS) inside the wells and between the wells. The thick oxide film 26 formed over the dielectric isolation region 21 prevents the MOS FET formed in the well from being in direct contact with the isolation region 21, and it is beneficial to the reduction of leak current.

Figure 4:
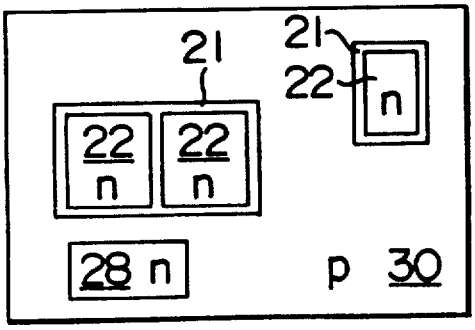
FIG. 4 is a partial plan view of a semiconductor chip.

FIG. 4 is a plan view showing an example of the chip layout. In the p type region 30, n type wells 22 surrounded by the dielectric isolation regions 21, and a pn-isolated n type well 28 are formed. The dielectric isolation region is not always needed between wells, as shown, and it may be provided only for the necessary portions.

Figure 5:
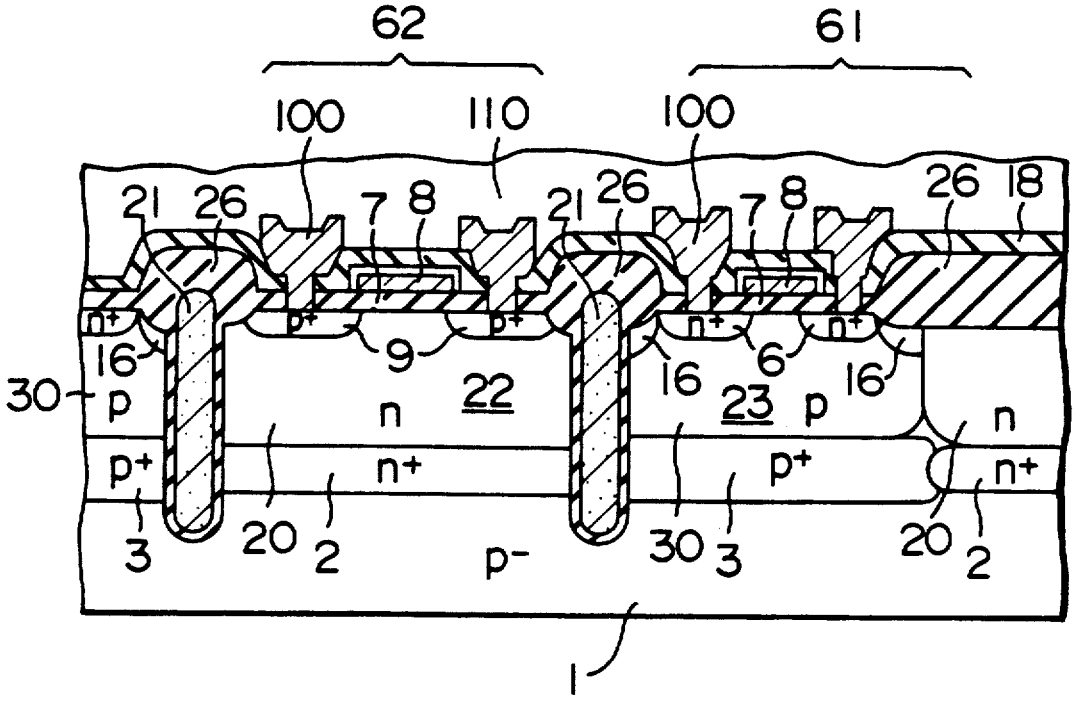
FIG. 5 is a partial cross-sectional view of a CMOS integrated circuit.

FIG. 5 shows part of a CMOS integrated circuit. On a $p^-$ type substrate 1, an [$n_+$] $n^+$ buried region 2 and $p^+$ buried region 3 are formed, on which are formed an n region 20 and p region 30, respectively. $P^+$ regions 9 are formed in the n type well 22 to form the source and drain of a p channel MOS FET 62, while $n^+$ regions 6 are formed in the p type well 30 to form the source and drain of an n channel MOS FET 61. A channel stopper 16 is formed around the source and drain regions 6 below the thick oxide film 26. Over the channel region between the source and drain, a gate electrode 8 of polysilicon or the like is formed through a gate insulation film 7 of oxide or the like. The source and drain regions are provided with source and drain electrodes 100. A dielectric isolation region 21 is provided around the n type well 22 including the p channel MOS FET 62.

The isolation region 21 isolates the nMOS transistor 61 from the pMOS transistor 62. The isolation region 21 may be made of a silicon oxide ($SiO_2$) film and polycrystalline silicon surrounded by the oxide film. The isolation region 21 extends at the boundary between the n type well 22 and the p type well 23, through $n^+$ buried region 2 and $p^+$ buried region 3 into the $p^-$ type [semi region] *semi-region* conductor substrate 1.

The foregoing structure allows a significant enhancement of the resistance against the latch-up phenomenon specific to CMOS. Latch-up is caused by the parasitic thyristor effect arising between the pMOS transistor 62 and the nMOS transistor 61. The structure shown in FIG. 5 has the dielectric isolation region 21 extending through the buried regions 2 and 3, and therefore the parasitic thyristor does not turn on. The reason is that the $p^+$ buried region 3 and $n^+$ buried region 2 exist in the base region of the parasitic npn and pnp transistors, respectively, preventing the diffusion of minority carriers. As a result, the current gain falls, and a semiconductor device with further enhanced latch-up voltage can be obtained.

Furthermore, this embodiment provides a new effect as will be described in the following. In the example shown in FIG. 9, the p type region 30 generally needs to have a depth of 4 μm or more in order to prevent the p region 30 from being punched through. Therefore, the dielectric isolation layer 21 has a depth of at least 4 μm.

In this embodiment, the problem of punch-through concerns with the n region 20. The n region 20 is followed at its bottom by the $n^+$ buried layer 2, and therefore punch-through does not occur even if the n region 20 is made thinner. The n region 20 may have a depth of 0.5-2.0 μm, or typically 1 μm, while the [$n_+$] $n^+$ buried region 2 may have a depth of 0.5-3.0 μm, or typically 1.5 μm. The dielectric isolation region 21 has a depth so that the region at least extends through the buried region, e.g., as deep as 2.5 μm, and it can be a shallow isolation region 1 as compared with the comparison example. Generally, the isolation region 21 is formed by etching or milling a deep groove in a semiconductor layer using the dry etching technique. The deeper the groove is, the more serious problems arise as concerns the decrease in the machining or processing accuracy and the occurrence of distortion or lattice defects by the machining or processing. Accordingly, the presence of the buried region in this embodiment allows a shallower isolation region 21, which significantly facilitates the device fabricating process.

The location of the groove is aligned or registered with the boundary of buried regions. Here, when the width of a groove is 1 μm, there is a positional tolerance of 0.5 μm on each side of the desired location (i.e. boundary). Even when the location of the groove is displaced more than this tolerance, it only results in occurrence of a small region of opposite conductivity type at the bottom portion of a well. Such a small region does not produce particularly harmful effect. The isolation region 21 surrounds the n type well region 22 and isolates it electrically from the p type well region 23. It is not necessary to provide dielectric isolation for all the n type well regions 22, but the dielectric isolation region may be provided only in necessary portions for the latch-up resistance or the like. The n type well at the right end of the figure is only provided with a pn isolation.

Moreover, according to this embodiment, since the side face of the $n^+$ buried region 2 is defined by the dielectric isolation region 21 which extends through the buried regions 2 and 3, adverse influences by the lateral diffusion of the [$n_+$] $n^+$ buried region, as explained in the example shown in FIGS. 10a and 10b can be avoided. This allows the dielectric isolation region 21 to have a decreased width from 6–7 [m] *μm* of the case of FIGS. 10a and 10b down to 1–2 μm.

Moreover, according to this embodiment, the $n^+$ buried region 2 is in contact at its circumference with the isolation region 21, and is separated from the $p^+$ buried region 3, resulting in a smaller electrostatic capacitance at the circumferential portion. Thus, a fast operating integrated circuit can be realized.

Next, an example of the fabricating process for the above-mentioned CMOS integrated circuit will be described in connection with FIGS. 6a–6h.

Figure 6A:
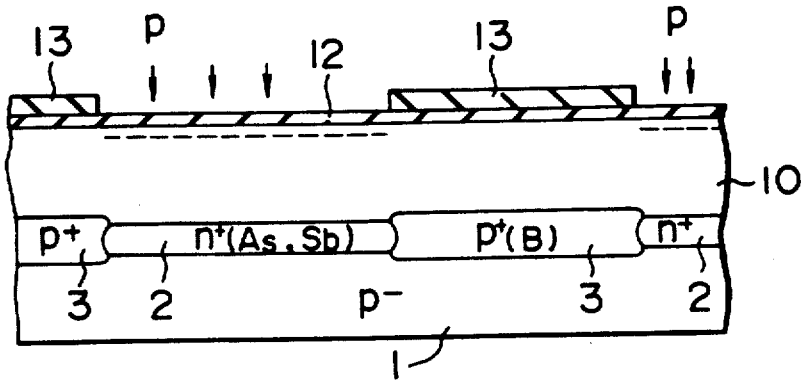
FIGS. 6a–6h are cross-sectional views showing the fabricating steps of the CMOS integrated circuit shown in FIG. 5.

First, $n^+$ to-be-buried regions 2 and $p^+$ to-be-buried regions 3 are formed in a surface region of a $p^-$ type silicon substrate 1 as shown in FIG. 6a and thereafter an n type epitaxial layer 10 having a substantially uniform distribution of impurity concentration is grown on the substrate 1 to a thickness of about 2 μm. The surface of the epitaxial layer 10 is subjected to oxidation so that a thin oxide film 12 of about 50 nm in thickness is formed, which is then coated with a nitride ($Si_3N_4$) film 13. Next, selective etching is conducted to partially remove the nitride film 13 at areas registered with the $n^+$ buried regions 2, while leaving the nitride film over the p buried regions 3. The conventional photoresist process is employed for the above selective etching. Next, phosphorus is doped by ion implantation into portions where the nitride film 13 is absent. Phosphorus is implanted through the thin oxide film 12 into the surface of the n type epitaxial layer 10, and an n type region 20 is formed in the subsequent processing step. Portions coated with the nitride film 13 is not doped with phosphorus due to masking by the film 13.

Figure 6B:
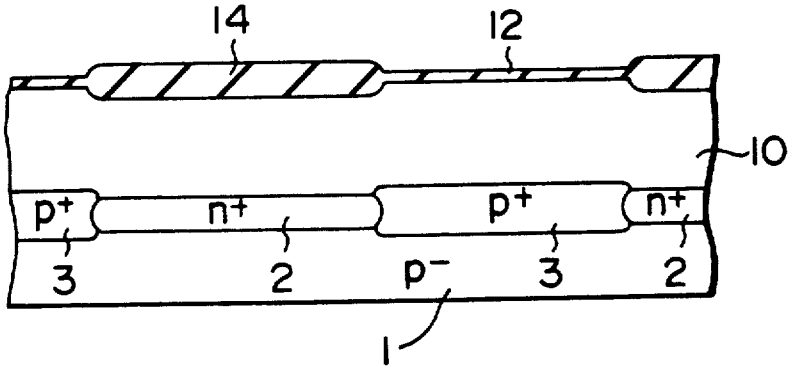

Following the phosphorus ion implantation, the wafer is heat-treated in an oxidizing atmosphere, with the result that the oxide film on the phosphorus-doped region further grows, while no oxidation takes place in portions coated with the nitride film and the original thin oxide thickness is retained, as shown in FIG. 6b. In this embodiment, the thicker portion 14 of the oxide film is made 150 nm. FIG. 6b shows the state when the nitride film 13 is removed.

Figure 6C:
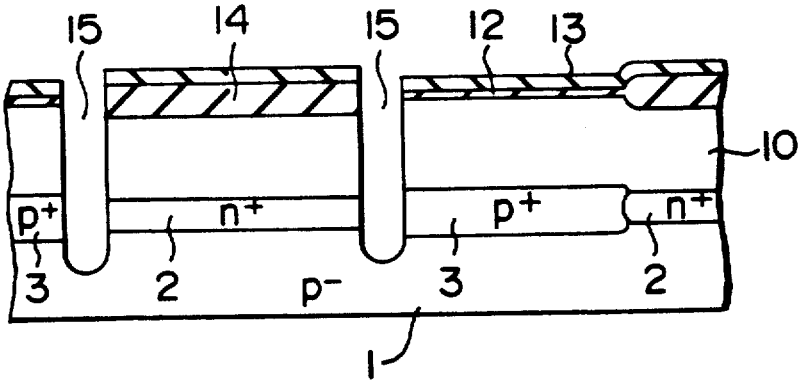

Next, the entire wafer surface is coated with a thick nitride film 13 to a thickness of about 200 nm, and part of the nitride film where the dielectric isolation region is to be formed is removed, as shown in FIG. 6c. Thereafter, silicon is dry-etched through the mask of nitride film, and a groove 15 of about 1–2 μm in width and 3–4 μm in depth is formed. It may be preferable to lightly wet-etch the dry-etched groove surface to remove the contamination and the damaged layer.

Figure 6D:
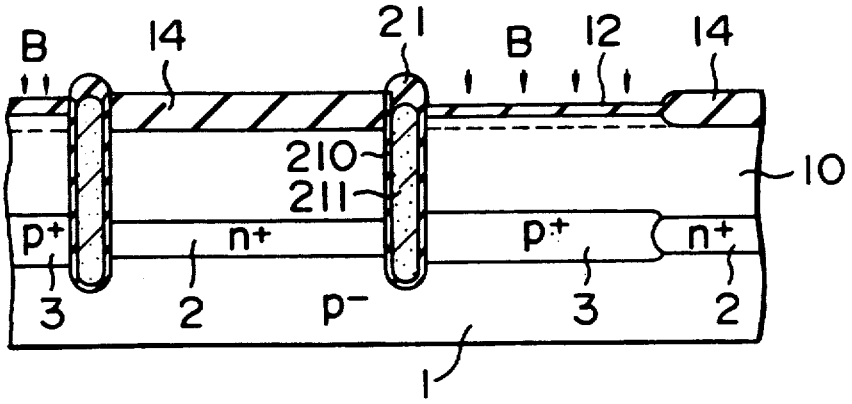

Next, the interior wall of the groove is oxidized so that an oxide film 210 is formed to a thickness of about 200 nm as shown in FIG. 6d. Then, polycrystalline silicon 211 of high resistivity is embedded in the groove, and the surface of the polycrystalline silicon exposed at the opening of the groove is oxidized to an oxide film. In such a way, the dielectric isolation region 21 is completed. After removing the nitride film 13, boron is implanted on the entire wafer surface. Since the region doped with phosphorus in the process of FIG. 6a has the thick oxide film 14 (see FIG. 6b), boron is not implanted in this area. Whereas, the oxide film in portion 12 not doped with phosphorus remains thin, and boron is implanted into the surface of the n type epitaxial layer 10 in this area.

Figure 6E:
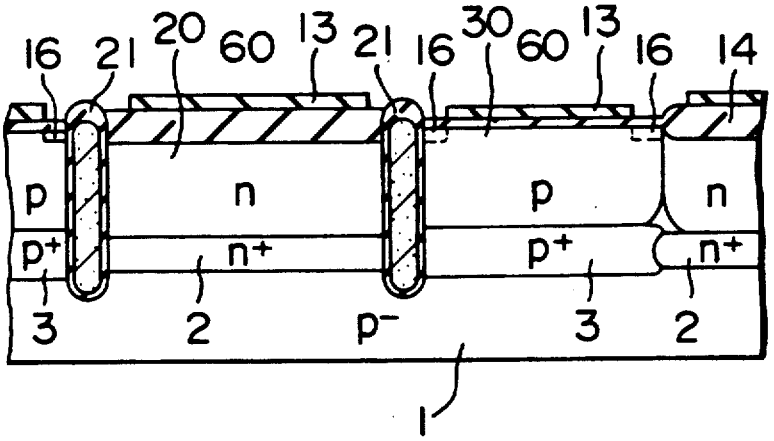

Next, the doped phosphorus and boron are diffused at a temperature of 1000°–1200° C. until they reach the $n^+$ and $p^+$ embedded regions 2 and 3. Thus, n regions 20 and p regions 30 are formed, as shown in FIG. 6e. A nitride film 13 is formed again, and is patterned to leave portions (referred to as "active regions 60") on the surface of the n region 20 and p region 30 where semiconductor elements such as MOS transistors will be made later. Then, boron implantation is conducted on the patterned wafer. Boron is implanted only in the portion where there is no nitride film and no thick oxide film as shown by 16. This implanted region serves as a channel stopper for the nMOS transistor.

Figure 6F:
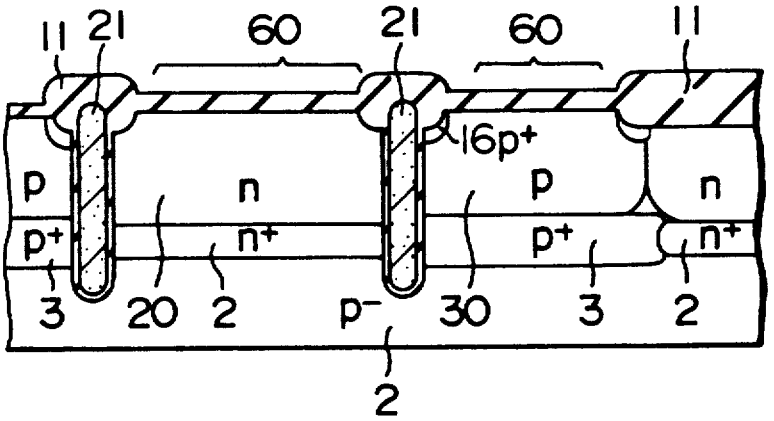
Figure 6G:
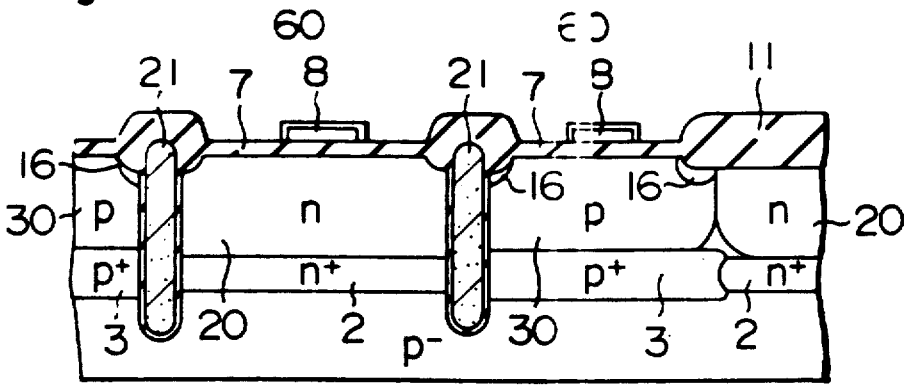

Next, local oxidation is conducted using the above nitride film so that a field oxide film 11 with a thickness of 1 μm is formed in portions excluding the active regions 60, as shown in FIG. 6f. Next, the oxide film is removed from the active regions 60 and, after a high quality gate oxide film 7 silicon is deposited to a thickness of 0.3 μm by the chemical vapor deposition (CVD) method. Then, the polycrystalline silicon layer is patterned as desired to form the gates 8 of MOS FETs, as shown in FIG. 6g.

Figure 6H:
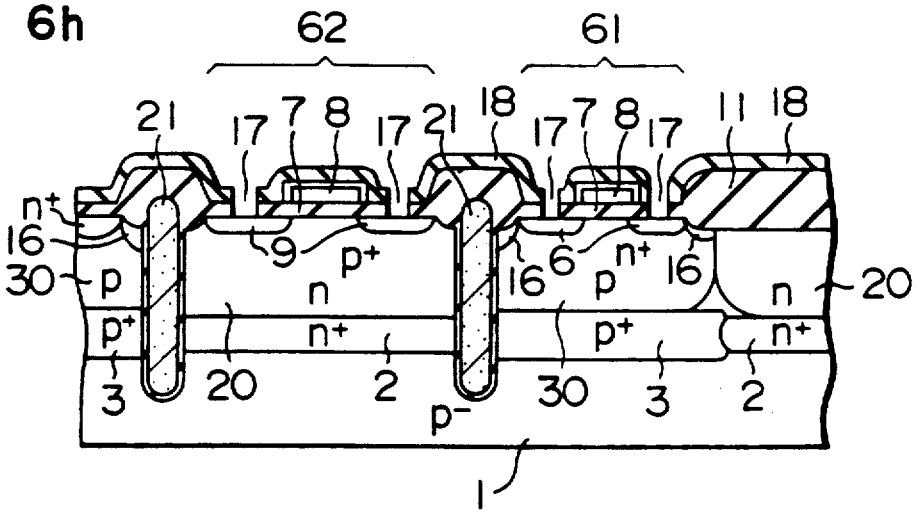

Next, by the self alignment method using the above polycrystalline silicon gate, the source/drain regions 9 of pMOS FET are formed in the active surface region of the n region 20 and the source/drain regions 6 of nMOS FET are formed in the active surface region of the p region 30, as shown in FIG. 6h. In this embodiment, the nMOS source and drain 6 are formed by arsenic ion implantation and the pMOS source and drain 9 are formed by boron implantation to a depth of 0.3 μm and 0.4 μm, respectively. Following the formation of the source and drain, a passivation film 18 of phosphosilicate glass is formed to a thickness of 0.5 μm, and then contact windows 17 are opened.

Finally, wirings 100 of aluminium or the like are formed and a final passivation layer 110 is coated to complete the device shown in FIG. 5.

Although the dielectric isolation region 21 was described as a groove filled with oxide and poly-Si, any material or combination of materials can be used provided that it can serve as a dielectric isolation. It may be formed of an insulator or a combination of insulators such as oxide, nitride and organic insulators. Alternatively, it may be an insulator-coated semiconductor. Also, although vertical grooves having substantially vertical side walls were shown, the grooves may have other cross sectional shapes. For example, the side wall may be slanted as in V groove.

Figure 7:
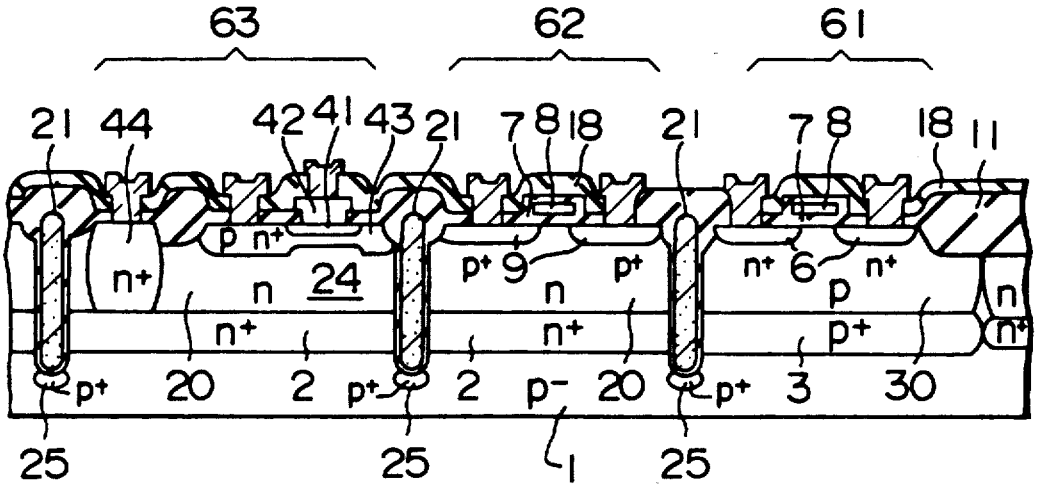
FIG. 7 is a partial cross-sectional view of a BI-CMOS integrated circuit.

FIG. 7 is a schematic cross-sectional view of a BI-CMOS integrated circuit, in which the same or equivalent portions to those in FIG. 5 are referred to by similar numerals or symbols. This embodiment differs from the previous one shown in FIG. 5 in that an npn vertical bipolar transistor 63 is formed in the n region 24. The bipolar transistor 63 has an emitter region 41 formed from heavily doped n type polycrystalline silicon 42. An $n^+$ type region is diffused therefrom into the single crystal Si region. A p type base region 43 and collector contact region 44 are formed by the ion implantation, as employed in the usual BJT process. The bipolar transistor 63 is isolated from each other by the dielectric isolation region described in connection with FIG. 5. For avoiding punch-through and formation of an npn parasitic transistor between the $n^+$ buried regions, a $p^+$ type buffer region 25, as mentioned in connection with FIG. 2, is further formed under the dielectric isolation region 21. The $p^+$ type region 25 is distanced from the $n^+$ type embedded subcollector region 2.

Due to on-chip integration of bipolar transistors and CMOS transistors, this embodiment realizes a novel LSI device having both properties of high driving ability featured by bipolar transistors and high integration and low power dissipation by CMOS. Moreover, the use of the deep dielectric isolation region 21 of insulator for the above bipolar transistor enables a smaller collector capacitance, whereby speed-up of the circuit can be enhanced.

Although CMOS transistors and npn bipolar transistors are integrated in the foregoing embodiment, this invention is not limited to such a combination, but can also be applied to the integration of various types of semiconductor elements.

As described above, semiconductor elements formed in well regions of different conductivity types can be integrated at a high density on a single chip without causing latch-up or punch-through, whereby an integrated circuit with superior isolation can be obtained.

FIGS. 8a–8l show another example of the method for fabricating wells having isolation regions suitable for use in the foregoing embodiments.

Figure 8A:
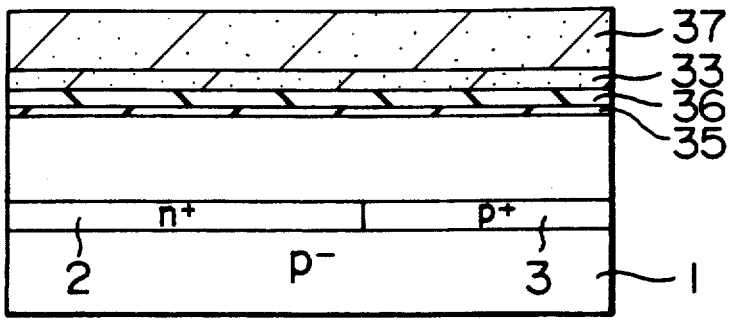
FIGS. 8a–8l are cross-sectional views showing the fabricating steps of another manufacturing method suitable for CMOS and BI-CMOS integrated circuits.

Initially, a surface of an epitaxial silicon substrate 1 having a buried layer is subjected to thermal oxidation to form a thermal oxide film 35 of 430 Å, for example, as shown in FIG. 8a. Next, an oxidation resistance mask 36, e.g., a silicon nitride film, of 1500 Å in thickness is deposited and a polysilicon film 33 with a thickness of 1000 Å is further deposited thereon.

Figure 8B:
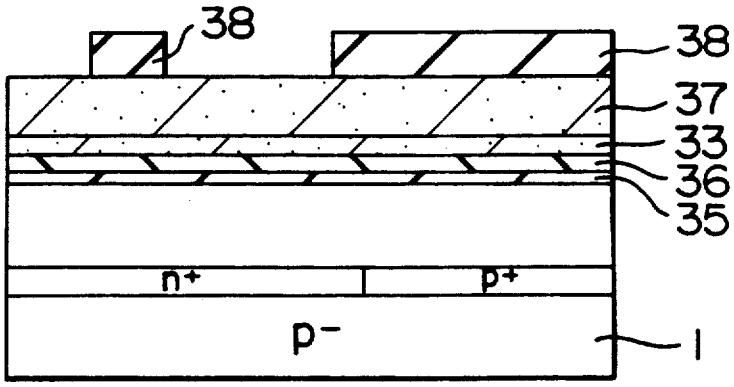
Figure 8C:
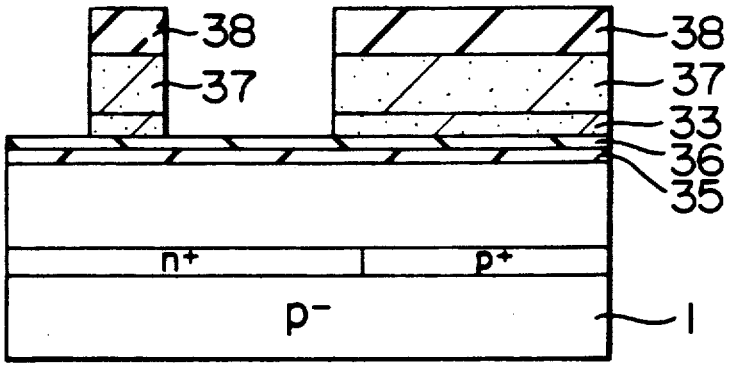
Figure 8D:
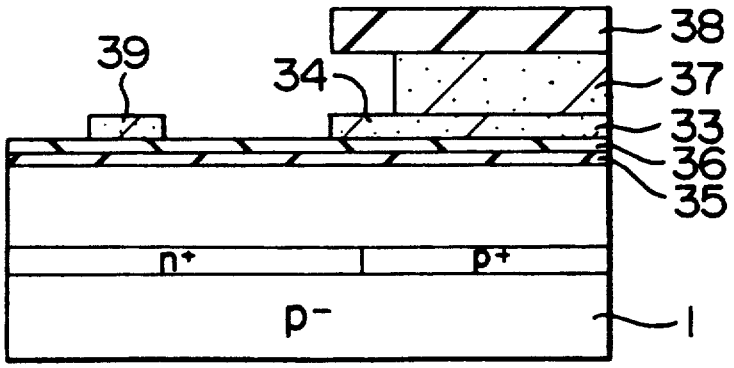
Figure 8E:
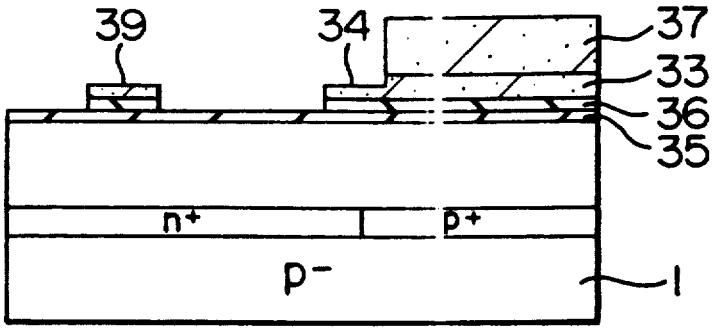

A polysilicon HLD film 37 with a thickness of 5000 Å is formed on the polysilicon film 33 by high-temperature, low-pressre deposition (HLD). Formation of an oxide film 35 is not compulsory. The HLD film 37 formed on the polysilicon film 33 may be of different material provided that it has an etching rate faster enough than that for the films 36 and 33 for a selected wet etching. The thickness of the film 37 is so selected that it will not be etched off entirely until the coming processing step 8g. The films 35, 36, 33 and 37 are given an arbitrary total thickness provided that they will not be etched off during the process until the isolation groove is formed. Subsequently, a photoresist 38 is patterned in the usual photolithographic process as shown in FIG. 8b, and then the HLD film 37 and polysilicon film 38 are removed by the dry etching method as shown in FIG. 8c. Next, wet etching is conducted using ammonia fluoride liquid, for example, so that the HLD film 37 is removed in narrow pattern portions, and a narrow polysilicon section 39 is formed as shown in FIG. 8d. For wide pattern portions, a section 34 with missing HLD film 37 on it is formed by side etching. Next, the photoresist 38 is removed, and by conducting dry etching until the silicon nitride film is removed, narrow patterns 39 and 34 are formed as shown in FIG. 8e. The condition of wet etching shown in FIG. 8d is determined such that the HLD film on the narrow pattern 39 is removed and a predetermined width of the pattern 34 is obtained. Setting of the width of the pattern 39 on the photomask is restricted by the value twice or less the setup width for the pattern 34. Using a film, instead of the HLD film 37, which meets the wet etching condition faster enough than that for both of the silicon oxide film and silicon nitride film, etching may be continued until the oxide film 35 is exposed in FIG. 8c. In this case, the polysilicon film 33 may be dispensed with.

Figure 8F:
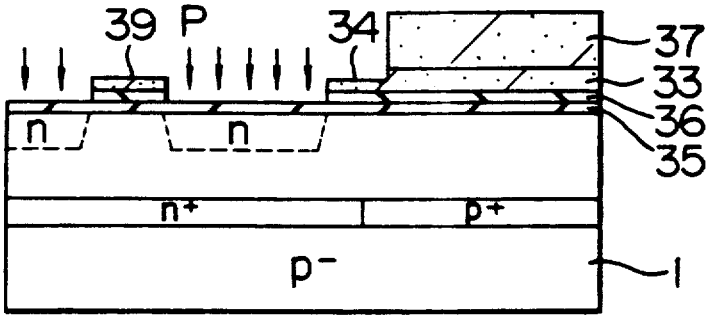
Figure 8G:
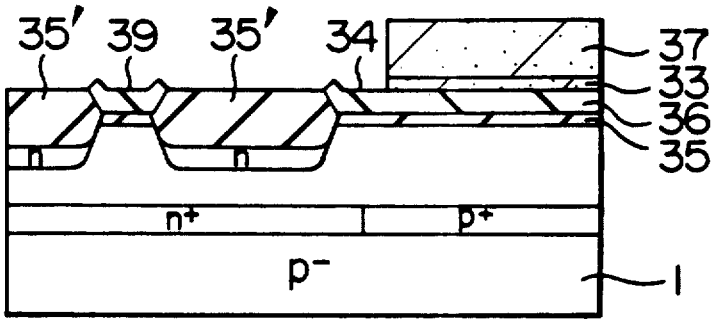
Figure 8H:
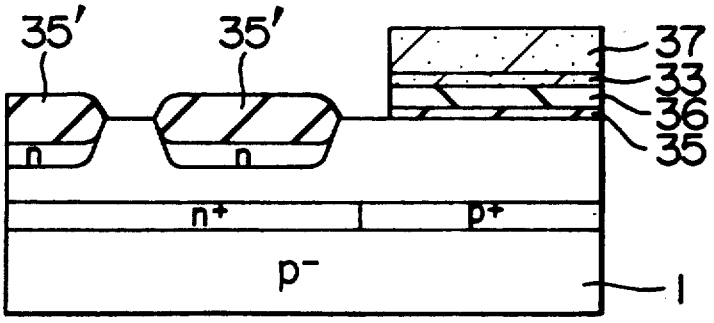
Figure 8I:
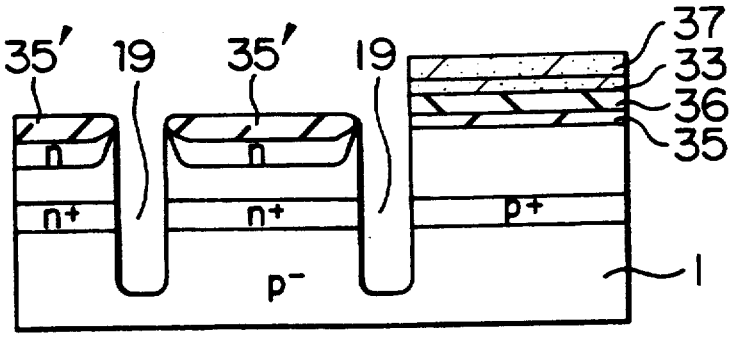
Figure 8J:
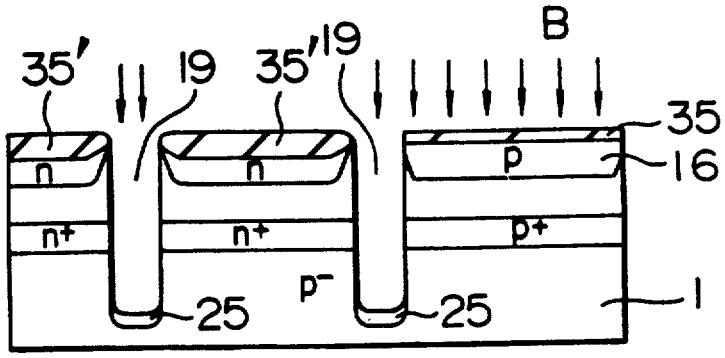

Next, n type impurity phosphorus is implanted to portions where the oxide film 35 is exposed by ion implantation as shown in FIG. 8f, and an n type layer is formed. Next, the polysilicon film remaining in portions 39 and 34 is removed, or otherwise this may be removed after the subsequent oxidation shown in FIG. 8g. Next, the silicon nitride film 36 is used as a mask to form a thermal oxide film 35′ to a thickness of 4000 Å example, as shown in FIG. 8g. The oxide film 35′ is made thick enough so as to be used as a mask for ion implantation following silicon dry etching described later. Next, by removing the silicon nitride film in the pattern portions 39 and 34 using hot phosphoric acid liquid, for example, and then by etching the oxide film, narrow regions of exposed silicon are formed as shown in FIG. 8h. Next, silicon is dry-etched to form grooves 19 as shown in FIG. 8i.

Figure 8K:
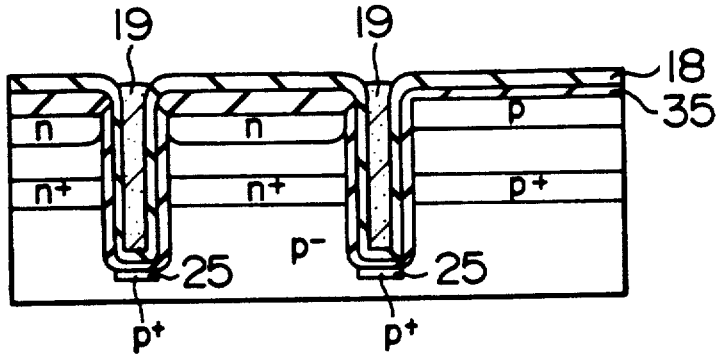
Figure 8L:
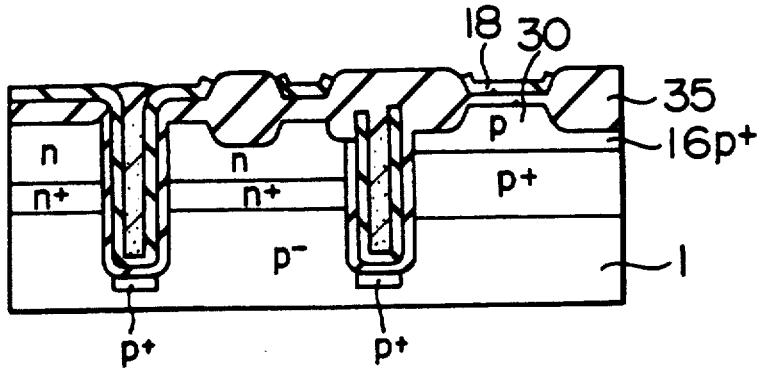

Next, when necessary, a channel stopper or buffer region 25 is formed at the bottom of each groove through the ion implanting of boron fluoride, for example, and the annealing process. Next, the remaining HLD film 37 is removed and, after the silicon nitride film 36 has been removed using hot phosphoric acid liquid, p type impurity such as boron fluoride is ion implanted to form a p type diffusion layer as shown in FIG. 8i. For this process, the oxide film 35′ must have a sufficient thickness so that it works as a mask of boron fluoride implantation. If necessary, oxidation may be conducted again before removal of the silicon nitride film 36. Thereafter, the isolation groove is filled by the conventional process and the dielectric isolation region is formed. For example, after the interior wall of the groove is oxidized, it is coated with a silicon nitride film 18, and then the groove is filled with polycrystalline silicon 19 as shown in FIG. 8k. Next, the selective oxidation region is patterned, and selective oxidation is conducted by forming a channel stopper 16 through the ion implantation of boron fluoride, for example, in the selective oxidation region on the p type diffusion layer. The process for reducing the stepping of the oxide film is added here when necessary, and the dielectric isolation region is completed as shown in FIG. 8l. This process provides a semiconductor structure with the formation of dielectric isolation grooves at the boundary between p type and n type diffusion region and at arbitrary position in the n type diffusion region. Finally, bipolar and CMOS structures are formed in respective isolated regions by the conventional method, and the semiconductor device is completed.

The foregoing processes may be modified in such a way of exchanging the position of the silicon nitride film 36 and the polysilicon film 33, or providing another cost of film to realize a structure of three layers or more. Alternatively, a single layer of silicon nitride film may be formed to an appropriate thickness in place of the combination of the silicon nitride film 36 and polysilicon film 33, and etching may be done up to the mid point of the thickness.

Although in the foregoing embodiment grooves are formed at the boundary between p type and n type diffusion layers and in an n type diffusion layer, it will be appreciated that the present invention is applicable to the structure having isolation grooves at the boundary between p type and n type regions and possibly at arbitrary position in any n or p type region, the structure having isolation grooves at the boundary between regions or different concentration of p type or n type and at arbitrary position in one type of region, and the structure having isolation grooves at arbitrary position in a single p type or n type diffusion region, etc.

We claim:

1. A monolithic complementary semiconductor device comprising a semiconductor substrate region of a first conductivity type, the substrate region having *a* surface;

semiconductor embedded regions of high impurity concentration disposed [ion] *on* and directly in contact with the surface of said substrate region and comprising at least a first embedded region of said first conductivity type and a second embedded region having a second conductivity type which is opposite to said first conductivity type, the first and second embedded regions having a spacing therebetween;

semiconductor well regions, of low impurity concentration compared to said embedded regions, disposed on said embedded regions, the semiconductor well regions extending to and forming a main surface, and comprising at least a first well region of the first conductivity type disposed on said first embedded region and a second well region of the second conductivity type disposed on said second embedded region, whereby the same spacing as between the first and second embedded regions is provided between the first and second well regions; and an insulating member extending from said main surface into said substrate region and filling the space between (1) said first well and embedded regions and (2) said second well and embedded regions nearest thereto, said insulating member surrounding said second well and embedded regions, and not surrounding said first well and embedded regions, whereby the first well and embedded regions are separated from the second well and embedded regions by said insulating member.

2. A monolithic complementary semiconductor device according to claim 1, further comprising;

a first doped region of said second conductivity type disposed in said first well region adjacent to said main surface; and a second doped region of said first conductivity type disposed in said second well region adjacent to said main surface.

3. A monolithic complementary semiconductor device according to claim 2, further comprising:

a third doped region of said second conductivity type disposed in said first well region adjacent to said main surface and separated from said first doped region by a predetermined distance;

first gate means for establishing an electric field and controlling a current path between said first and third doped regions;

a fourth doped region of said first conductivity type disposed in said second well region adjacent to said main surface and separated from said second doped region by a predetermined distance; and a second gate means for establishing an electric field and controlling a current path between said second and fourth doped regions.

4. A monolithic complementary semiconductor device according to claim 1, wherein said semiconductor is silicon and said insulating member includes a body of polycrystalline silicon and a layer of insulating material surrounding the body of polycrystalline silicon.

5. A monolithic complementary semiconductor device according to claim 4, wherein said insulating material includes silicon oxide.

6. A monolithic complementary semiconductor device *according to claim 1, further comprising:*

*a semiconductor isolation region of said first conductivity type having a higher impurity concentration than that of said substrate region disposed in said substrate region under said insulating member and surrounding said second embedded region.*

7. A monolithic complementary semiconductor device according to claim 1, wherein said embedded regions further [comprises] *comprise* a third embedded region of said second conductivity type, said well regions further [comprises] *comprise* a third well region of said second conductivity type, *the third well region being disposed on the third embedded region,* the device further comprising:

a base region of said first conductivity type formed in said third well region adjacent to said main surface;

an emitter region of said second conductivity type formed in said base region adjacent to said main surface; and a collector contact region of said second conductivity type formed in said third well region adjacent to said main surface.

8. A monolithic complementary semiconductor device according to claim 7, further comprising:

a semiconductor isolation region of said first conductivity type, having a higher impurity concentration than that of said substrate region, disposed in said substrate region under said insulating member and surrounding said third embedded region.

9. A monolithic complementary semiconductor device according to claim 8, further comprising:

a first and a third doped region of said second conductivity type disposed in said first well region adjacent to said main surface with a predetermined distance therebetween;

first gate means for establishing an electric field and controlling a current path between said first and third doped regions;

a second and fourth doped regions of said first conductivity type disposed in said second well region adjacent to said main surface with a predetermined distance therebetween; and second gate means for establishing an electric field and controlling a current path between said second and fourth doped regions.

10. A monolithic complementary semiconductor device according to claim 9, further comprising:

a channel stop region of said first conductivity type formed in said first well region, surrounding said first and third doped regions and disposed adjacent to said insulating member.

11. A monolithic complementary semiconductor device according to claim 8, wherein said semiconductor isolation region is separated from said embedded regions.

12. A monolithic complementary semiconductor structure according to claim 19, further comprising:

a semiconductor buffer region of said first conductivity type, having a higher impurity concentration than that of said substrate region, disposed in said substrate region under said insulating member, and surrounding and separated from said second embedded region.

13. A bipolar and complementary MOS integrated circuit device comprising:

a semiconductor chip of a first conductivity type having a high resistivity, said chip having a surface;

a bipolar junction transistor (BJT) well formed in said semiconductor chip, extending from said surface of the chip, and including a vertical BJT which has a heavily doped sub-collector region of a second conductivity type, embedded at the bottom of said BJT well;

complementary MOS field effect transistor (CMOS [FET] *FET*) wells formed in said semiconductor chip, extending from said surface of the chip, and including a first well of the first conductivity type which includes a MOS transistor of the second conductivity type and has a first heavily doped embedded region of the first conductivity type buried at the bottom of said first well, and a second well of the second conductivity type *which includes a MOS transistor of the first conductivity type* and has a second heavily doped embedded region of the second conductivity type buried at the bottom of [sad] *said* second well;

dielectric isolation member disposed in said semiconductor chip, vertically extending from the surface of said chip to a depth deeper than said first and second heavily doped embedded regions, and separating said BJT and CMOS FET wells from one another, said dielectric [insolation] *isolation* member surrounding said BJT well and said second well of said second conductivity type but does not surround said first well of the first conductivity type; and semiconductor isolation region of said [firs] *first* conductivity type having a higher impurity concentration than that of the semiconductor chip, disposed under said dielectric isolation member in said semiconductor chip, and surrounding and separated from said sub-collector region.

14. A monolithic complementary semiconductor device according to claim 1, further comprising field effect transistors of opposite conductivity type provided respectively in surface portions of the first and second well regions.

15. A monolithic complementary semiconductor device according to claim 1, wherein the first and second embedded regions are disposed at a substantially equal level beneath the main surface.

16. A monolithic complementary semiconductor device according to claim 1, wherein said insulating member includes a thick oxide film at said [gain] *main* surface.

17. A monolithic complementary semiconductor device according to claim 1, wherein said insulating member has side walls extending vertically from said main surface.

18. A monolithic complementary semiconductor device according to claim 1, wherein said insulating member is a dielectric isolation member including insulating material interposed between (1) the first well and embedded regions and (2) the second well and embedded regions, in said spacing therebetween.

19. A monolithic complementary semiconductor structure comprising:

a semiconductor substrate region of a first conductivity type, the substrate region having a surface;

semiconductor wells disposed contiguously on said substrate region, with at least one semiconductor well of a first conductivity type and at least one semiconductor well of a second conductivity type which is opposite to said first conductivity type, the semiconductor wells of the first and second conductivity types being spaced from each other;

the semiconductor wells of the first conductivity type each comprising a first embedded region of high impurity concentration of said first conductivity type disposed contiguously on the substrate region and a semiconductor active region of low impurity concentration compared to said first embedded region disposed on said first embedded region;

the semiconductor wells of the second conductivity type each comprising a second embedded region of high impurity concentration of said second conductivity type disposed contiguously on the substrate region and a semiconductor active region of low impurity concentration compared to said second embedded region disposed on said second embedded region;

the semiconductor active regions of the semiconductor wells forming a main surface of the structure; and an insulating member extending from said main surface into said substrate region and filling the space between the semiconductor wells of the first and second conductivity types, so as to separate the semiconductor wells of the first and second conductivity types [form] *from* each other, said insulating member surrounding said at least one semiconductor well of the second conductivity type and not surrounding said at least one semiconductor well of the first conductivity type.

20. A monolithic complementary semiconductor structure according to claim 19, wherein said insulating member is a dielectric isolation member including [insulting] *insulating* material interposed between the semiconductor wells of the first and second conductivity types in the space therebetween.

21. A bipolar and complementary MOS integrated circuit device according to claim 13, wherein said heavily doped sub-collector region of a second conductivity type embedded at the bottom of said BJT well, and the first and second heavily doped embedded regions respectively buried at the bottom of the first and second wells, are in direct contact with semiconductor material of the semiconductor chip of first conductivity type.

*22. A bipolar and complementary MOS integrated circuit device comprising:*

*a semiconductor chip of a first conductivity type having a high resistivity, said chip having a surface;*

*a bipolar junction transistor (BJT) well formed in said semiconductor chip, extending from said surface of the chip, and including a vertical BJT which has a heavily doped sub-collector region of a second conductivity type, embedded at the bottom of said BJT well;*

*complementary MOS field effect transistor (CMOS FET) wells formed in said semiconductor chip, extending from said surface of the chip, and including a first well of the first conductivity type which includes a MOS transistor of the second conductivity type and has a first heavily doped embedded region of the first conductivity type buried at the bottom of said first well, and a second well of the second conductivity type which includes a MOS transistor of the first conductivity type and has a second heavily doped embedded region of the second conductivity type buried at the bottom of said second well;*

*dielectric isolation member disposed in said semiconductor chip, vertically extending from the surface of said chip to a depth deeper than said first and second heavily doped embedded regions, said dielectric isolation member surrounding said BJT well; and*

*semiconductor isolation region of said first conductivity type having a higher impurity concentration than that of the semiconductor chip, disposed under said dielectric isolation member in said semiconductor chip, and surrounding and separated from said sub-collector region.*

*23. A bipolar and complementary MOS integrated circuit device according to claim 22, wherein said dielectric isolation member, surrounding said BJT well, does not surround the CMOS FET wells.*

*24. A bipolar and complementary MOS integrated circuit device according to claim 22, wherein said dielectric isolation member, surrounding said BJT well, does not surround said first well of said first conductivity type.*

*25. A bipolar and complementary MOS integrated circuit device according to claim 22, wherein said second well of the second conductivity type is also surrounded by said dielectric isolation member.*

*26. A bipolar and complementary MOS integrated circuit device according to claim 25, wherein said dielectric isolation member, surrounding said BJT well, does not surround said first well of said first conductivity type.*

*27. A bipolar and complementary MOS integrated circuit device according to claim 22, wherein said dielectric isolation member, surrounding said BJT well, separated the BJT well and the second well of the second conductivity type from the first well of the first conductivity type.*

*28. A bipolar and complementary MOS integrated circuit device comprising:*

*a semiconductor chip of a first conductivity type having a high resistivity, said chip having a surface;*

*a bipolar junction transistors (BJT) well formed in said semiconductor chip, extending from said surface of the chip, and including a vertical BJT which has a heavily doped sub-collector region of a second conductivity type, embedded at the bottom of said BJT well;*

*complementary MOS field effect transistor (CMOS FET) wells formed in said semiconductor chip, extending from said surface of the chip, and including a first well of the first conductivity type which includes a MOS transistor of the second conductivity type and has a first heavily doped embedded region of the first conductivity type buried at the bottom of said first well, and a second well of the second conductivity type which includes a MOS transistor of the first conductivity type and has a second heavily doped embedded region of the second conductivity type buried at the bottom of said second well;*

*dielectric isolation member disposed in said semiconductor chip, vertically extending from the surface of said chip to a depth deeper than said first and second heavily doped embedded regions, and separating said BJT and CMOS FET wells from one another, said dielectric isolation member surrounding said BJT well but does not surround said CMOS FET wells; and*

*semiconductor isolation region of said first conductivity type having a higher impurity concentration than that of the semiconductor chip, disposed under said dielectric isolation member in said semiconductor chip, and surrounding and separated from said sub-collector region.*

*29. A monolithic complementary semiconductor structure comprising:*

*a semiconductor substrate region of a first conductivity type, the substrate region having a surface;*

*semiconductor wells disposed contiguously on said substrate region, with at least one semiconductor well of a first conductivity type and at least one semiconductor well of a second conductivity type which is opposite to said first conductivity type, the semiconductor wells of the first and second conductivity types being spaced from each other;*

*the semiconductor wells of the first conductivity type each comprising a first embedded region of high impurity concentration of said first conductivity type disposed contiguously on the substrate region and a semiconductor active region of low impurity concentration compared to said first embedded region disposed on said first embedded region;*

*the semiconductor wells of the second conductivity type each comprising a second embedded region of high impurity concentration of said second conductivity type disposed contiguously on the substrate region and a semiconductor active region of low impurity concentration compared to said second embedded region disposed on said second embedded region;*

*the semiconductor active regions of the semiconductor wells forming a main surface of the structure; and*

*an insulating member extending from said main surface into said substrate region, said insulating member surrounding said at least one semiconductor well of the second conductivity type and not surrounding said at least one semiconductor well of the first conductivity type.*

*30. A monolithic complementary semiconductor structure according to claim 29, wherein said insulating member separates the semiconductor wells of the first and second conductivity types from each other.*

*31. A monolithic complementary semiconductor structure according to claim 29, wherein said insulating member extends from said main surface into said substrate region in the space between the semiconductor wells of the first and second conductivity types.*

* * * * *